United States Patent [19]
Grundmann

[11] Patent Number: 5,978,571
[45] Date of Patent: *Nov. 2, 1999

[54] METHOD AND APPARATUS FOR SYNCHRONOUS CIRCUIT SIMULATION DESIGN BY ELIMINATING UNNEEDED TIMING BEHAVIORS PRIOR TO SIMULATION RUN-TIME

[75] Inventor: William John Grundmann, Westboro, Mass.

[73] Assignee: Digital Equipment Corporation, Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/854,419

[22] Filed: May 12, 1997

Related U.S. Application Data

[63] Continuation of application No. 08/488,711, Jun. 8, 1995, abandoned, which is a continuation of application No. 08/034,564, Mar. 19, 1993, abandoned.

[51] Int. Cl.⁶ ..................................................... G06F 9/455
[52] U.S. Cl. ............................................................. 395/500
[58] Field of Search ............................................. 395/500

[56] References Cited

U.S. PATENT DOCUMENTS

| | | | |
|---|---|---|---|
| 4,775,950 | 10/1988 | Terada et al. ........................... | 364/578 |
| 4,945,503 | 7/1990 | Takasaki ................................. | 364/578 |
| 5,018,089 | 5/1991 | Kanazawa ............................... | 364/578 |
| 5,062,067 | 10/1991 | Schaefer et al. ........................ | 364/578 |
| 5,068,812 | 11/1991 | Schaefer et al. ........................ | 364/578 |
| 5,245,549 | 9/1993 | Shoji et al. ............................. | 364/489 |

OTHER PUBLICATIONS

F. Hirose; Performance Evaluation of an Event–Driven Logic Simulation Machine; Jun. 12, 1992; 29th ACM/IEEE Design Automation Conf.; pp. 428–431.

M. Saitoh; Logic Simulation System Using Simulation Processor (SP) 1988; 25th ACM/IEEE Design Automation Conf.; pp. 225–230.

*Primary Examiner*—David Y. Eng
*Attorney, Agent, or Firm*—Hamilton, Brook, Smith & Reynolds, P.C.

[57] ABSTRACT

A method for use in the design or implementation of a synchronous circuit having nodes interconnecting logic functions and in which the nodes assume logic values in successive clocked phases of a logical cycle. For a phase for a node connected to an output of a logic function, a determination is made (and stored) of which nodes, connected to inputs of the logic function, have and do not have timing behaviors in that phase which are needed in order to determine the logic value assumed by the output node in that phase.

7 Claims, 13 Drawing Sheets

| Initial State | | Glitch Status | | Transition Status | | Final State | |
|---|---|---|---|---|---|---|---|
| ⸺20 | | ⸺22 | | ⸺24 | | ⸺26 | |
| bit 7 | bit 6 | bit 5 | bit 4 | bit 3 | bit 2 | bit 1 | bit 0 |
| High | Low | Glitch High | Glitch Low | Rise | Fall | High | Low |
FIG. 5
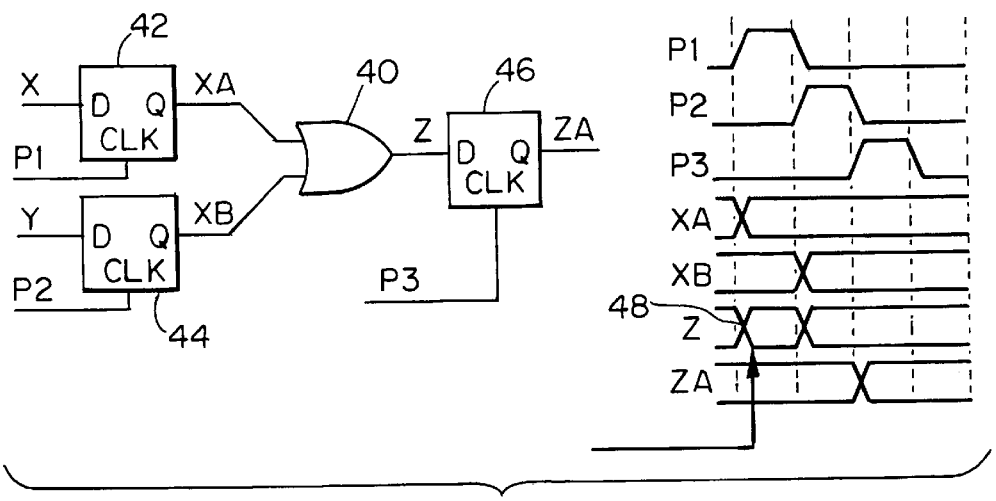
FIG. 6A
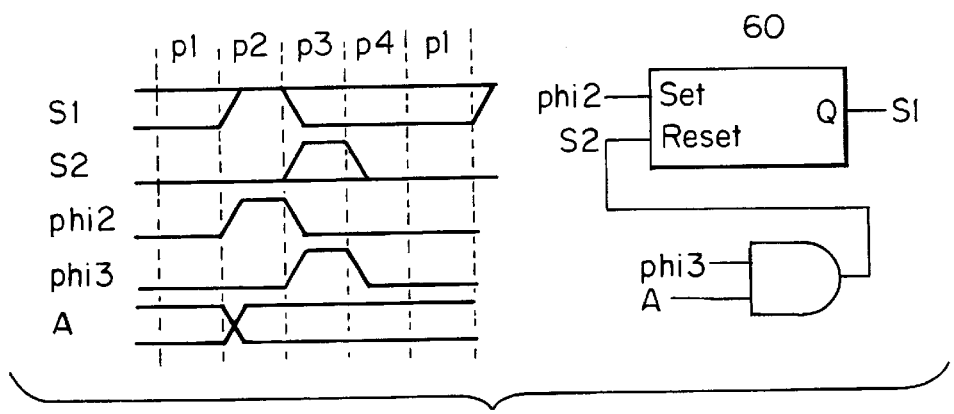
FIG. 7

METHOD AND APPARATUS FOR SYNCHRONOUS CIRCUIT SIMULATION DESIGN BY ELIMINATING UNNEEDED TIMING BEHAVIORS PRIOR TO SIMULATION RUN-TIME

This application is a continuation of application Ser. No. 08/488,711 filed Jun. 8, 1995, now abandoned which was a continuation of application Ser. No. 08/034,564 filed Mar. 19, 1993 now abandoned.

BACKGROUND OF THE INVENTION

This invention relates to verification of circuit design.

Although the cost of mass producing electronic circuit chips is relatively low per chip, the cost of producing a small number of prototype chips to verify a circuit design is extremely high per chip. Correcting circuit design errors before chips are produced is thus desirable.

Circuit Design

The circuit design is captured in a specification of a set of desired functions. The specification explains how the outputs of the circuit should behave in response to given inputs over time.

In the circuit design specification, the desired functions may be represented at one or more different levels of detail, ranging from broad descriptions of logical functions, to specific interconnections of logical components at a so-called switch level.

For example, referring to FIG. 1, a circuit design may comprise primitives 10 (gates or devices) that represent the functions. The primitives have input and output terminals that are electrically connected to other primitives. All of the commonly shared interconnections at a given point in the circuit design are together called a node. For example, a node C includes connections to the output of the gates that have inputs A and B and to the input of the gate that has outputs X and Y.

The receipt by a gate of inputs from the outputs of other logic functions is called fan-in; the delivery by a gate of outputs to one or more other function inputs is called fan-out. The overall circuit has primary inputs that affect the operation of the overall circuit; and selected outputs of some functions are outputs of the overall circuit.

Verification

The process of checking a circuit design is called verification. Verification may be categorized as either static (in which the structural aspects of the design are analyzed) or dynamic (in which the operation of the circuit over time is simulated). Static analysis is appropriate to certain aspects of a circuit design, e.g., connectivity (correct interconnection of the inputs, nodes, and outputs) and timing (signals reaching their intended destinations at the correct times). Dynamic analysis is suitable for other aspects of verification, e.g., correct logical functioning.

Dynamic simulation may be done at different levels of detail corresponding to the possible different levels of detail of the circuit design specification (functional level, gate level, component level). At a low enough level the simulation may require chip specific information, such as timing delay associated with propagating signals across the chip.

Dynamic Simulation

Typically, in dynamic simulation, a variety of combinations of input "signals" are fed to a software model of the circuit. The model performs operations on the signals which mirror the ones to be performed by the circuit. Resulting output "signals" are compared with the known output signals that the circuit is designed to generate. Normally it is not feasible to test all possible combinations of input signals. The circuit designer makes the choice of which combinations of inputs and clocks should be used and indicates what output results are expected.

Simulation models may have many different forms and accuracy levels. Low-level models (e.g., SPICE models) include details of circuit properties of individual components of the design. This kind of model accurately models device delays, capacitance effects, and non-linearities.

Some higher-level models (e.g., gate models) are generated from the bottom up by abstracting higher-level functional descriptions from lower-level details, with a corresponding reduction of detailed circuit information. This kind of model retains the logical design and timing of functions.

Other higher-level models (e.g., RTL-based) are generated from the top down. The circuit designer creates a description using a HDL (Hardware Description Language) that may or may not capture implementation details or functional timing.

Higher-level simulations, though less accurate, tend to operate faster than lower-level simulations, and are useful in verifying general aspects of the design. Lower-level simulations may be 100 to 10,000 times slower, but are more accurate.

Some circuit designers verify a circuit once for common bugs using a higher-level simulation and then again (with as many input combinations as possible) using a lower-level description to find the bugs introduced in a particular implementation.

Clocks, Timing Behavior

A circuit design of the synchronously clocked type is governed by successive major clock cycles. At the beginning of each new clock cycle, the circuit may restart an operation similar to one just completed. The major cycles are usually divided into subcycles called phases.

Referring to FIG. 2, for example, in a four-phase cycle 12, a signal foo 14 is always high in phase p1, and may make a conditional transition to a low value in phase p2. The foo signal may be either high or low in each of the three phases p2, p3, and p4; foo never changes in p3 or p4.

Thus, timing behavior information tells when a node or signal can undergo a transition, whether a node or signal is a constant high or low in a particular phase, and what logic values the node might attain over time.

The timing behavior of a particular node in a circuit design depends on the logical function it represents, and on the logical and timing behavior of the inputs to the function. Referring to FIG. 3, node fred 16 is the logical AND of inputs A and B. Fred is low for phases p1, p2, and p4, and may conditionally change to high or stay low in phase p3. In a typical circuit design, a signal like B is called a clock, and a signal like fred is a conditional clock (i.e., clock B conditioned by signal A).

Timing behavior information may be used, for example, to reduce the amount of reporting, by capacitance coupling analysis tools, of possible circuit failures due to noise. Cross-coupling analyzers also may depend upon the accuracy of timing behavior information. Static analysis of goodness, i.e., the degree to which the circuit design adheres to a particular clocking and latching methodology, or the extent of glitches caused by timing races, depends on knowing which signals behave like clocks and conditional clocks. Some false path elimination is aided by timing behavior information.

Circuit designers typically show timing behavior information in manually generated pictorial form.

Compile-mode Simulation

Some brute-force dynamic simulators capture a model of every device and interconnection in the circuit. For each phase of the clock, the simulator model exercises every device in the model based on its inputs and, as appropriate, propagates the outputs from the devices to all other devices to which they are connected. Some simulation models are generated automatically from a description of the devices, interconnections, and clocks which make up the circuit design. The descriptions may be expressed in a computer programming language, such as the C language. Procedures or functions may be used to express the functional aspects of the circuit, and variables may be used to describe the values of inputs and clocks. The programming language description is then compiled to form an executable program which is a simulator for the circuit. This technique is called compile-mode simulation. When the circuit design is later changed, the simulation can be redone simply by regenerating and recompiling the programming language description.

In compiled-mode simulation a multi-phase clock can be simulated in a programming language, by a global variable, e.g., simulator phase, which takes on values corresponding to the successive phases of the clock in a fixed, prescribed order. For example, a three phase clock may be represented by global values Phase1, Phase2, and Phase3, where the simulator changes the value of the variable simulator_Phase by repeatedly cycling through the values Phase1, Phase2, Phase3, in that order.

Each procedure or function, corresponding to a device in the circuit design, can then be modelled by conditionally executing code depending on which phase the variable simulator_phase is set to. An example of a pseudo-code template for every procedure in a compile-mode simulator for a circuit with a three phase clock follows.

procedure device ( i1, i2, . . . , in: inputs; o1, o2, . . . , om: outputs;)
begin
  case simulator_phase of
    Phase1: . . .
    Phase2: . . .
    Phase3: . . .
  end case;
end procedure;

Complex circuit designs produce complex compile-mode simulations, requiring the simulation to perform extremely large numbers of operations per clock phase. The performance of a simulator is measured in part by the rate at which it executes circuit design clock cycles in each real-time second.

SUMMARY OF THE INVENTION

In general, in one aspect, the invention features a method for use in designing or implementing a synchronous circuit having nodes interconnecting logic functions and in which the nodes assume logic values in successive clocked phases of a logical cycle. For a phase for a node connected to an output of a logic function, a determination is made (and stored) of which nodes, connected to inputs of the logic function, have and do not have timing behaviors in that phase which are needed in order to determine the logic value assumed by the output node in that phase, Embodiments of the invention include the following features. The stored information may be used to reduce the number of evaluations, of logic values assumed by said nodes, which are made in running a computer simulation of said circuit. The stored information may also be used to reduce the number of logic functions required to implement the circuit. The step of determining is performed initially with respect to output logic functions connected to pre-identified outputs of the circuit and is repeated for logic functions whose outputs are identified as having timing behaviors needed for the output logic functions, and so on, iteratively. The step of determining is performed successively for all phases for the node connected to the output of the logic function. The step of determining includes analyzing which of the nodes, which are inputs to the logic function, enable or dominantly block the logical function. The step of analyzing is table driven and performed iteratively with respect to successive logic functions in an input chain of functions. The table associates with each combination of logic function and timing behavior, an indication of a procedure to use in determining whether nodes connected as inputs to the logic function have timing behaviors which are needed or not needed.

Among the advantages of the invention are the following. Once the unneeded timing behaviors for a node in a given phase is determined the simulation may be performed more efficiently by not evaluating that node in that phase.

Other advantages and features will become apparent from the following description of the preferred embodiment and from the claims.

BRIEF DESCRIPTION OF THE DRAWINGS

We first briefly describe the drawings.

FIGS. 1 through 4, and 6 through 11 are timing behavior diagrams and related logic diagrams.

FIG. 5 is a bit position chart.

DESCRIPTION OF THE PREFERRED EMBODIMENTS

Automatic generation of logical timing behavior information

Timing behavior of a node describes the node's data values and transitions in each phase of the logical cycle. A node's behavior in a phase can be broken into three parts:

1. its value at the beginning of the phase, either True, or False, or Valid (which may be either a True or a False value).

2. changes to the node during the phase:
   a. no transition; the node value remains either True, False, or Valid.
   b. no transition but node has glitches, either high-glitching-low or low-glitching-high, or both.
   c. could make or always makes at most one transition, either conditionally or unconditionally, True-to-False, or False-to-True.
   d. could make both transitions, True-to-False and False-to-True.
   e. as in "c" or "d", but with glitch, either high-glitching-low or low-glitching-high, or both.

3. value at the end of the phase, either True, or False, or Valid.

Thus, a description of a node phase as T-T means a signal enters a phase with only a True value (T), does not make any transitions or glitches, and exits the phase with only a True value (T). A more complex example is V-CGT. The signal enters the phase with either a True or False value (V), may undergo a transition to any value during the phase (C), may have a True-glitch only (GT), and exits the phase with either a True or False value.

Figure 4:
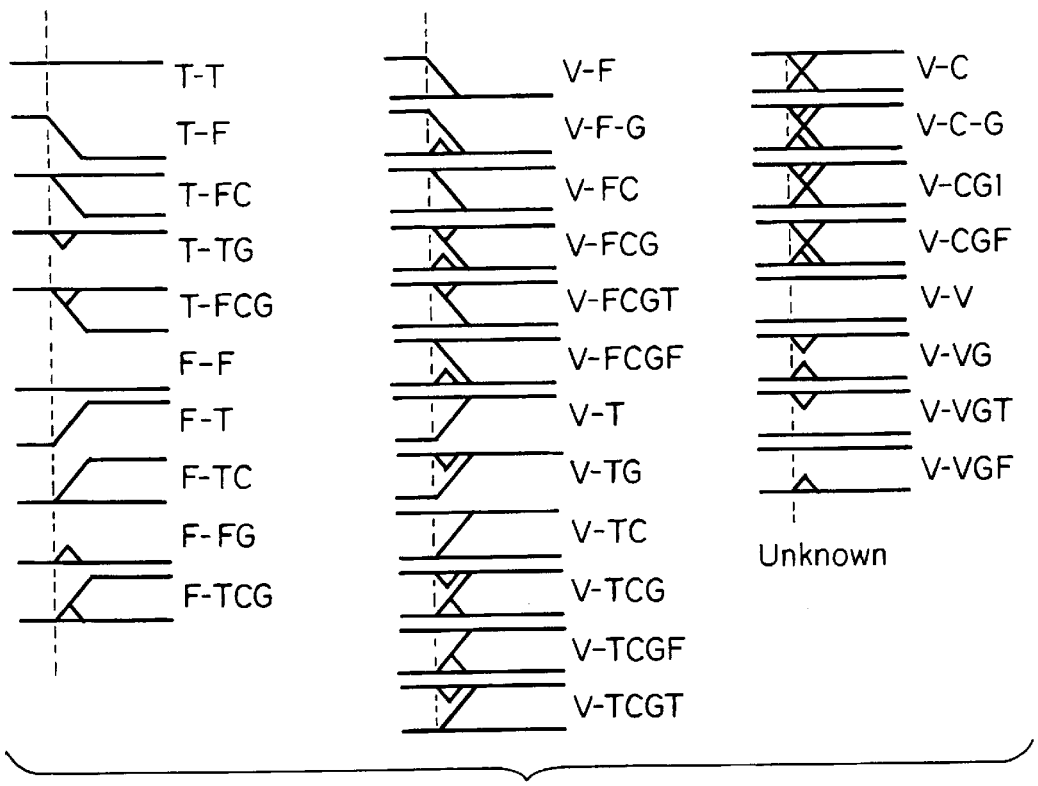

Each node phase is classified as having one of the following 31 possible behaviors (the corresponding timing behaviors are shown graphically in FIG. 4):

T-T
T-F
T-FC
T-TG
T-FCG
F-F
F-T
F-TC
F-FG
F-TCG
V-F
V-FG
V-FC
F-FCG
V-FCGT
V-FCGF
V-T
V-TG
V-TC
V-TCG
V-TCGF
T-TCGT
V-C
V-CG
V-CGT
V-CGF
V-V
V-VG
V-VGT
V-VGG
Unknown The timing behavior for each node phase is encoded into a single byte of memory. A four phase cycle for a node would be represented by four bytes, with one byte used per phase.

Referring to FIG. 5, each timing behavior byte is divided into four fields of two bits each.

The first field 20 contains the initial state of the node as it enters the phase. The possible values are State_High(10), State_Low(01), State_Valid(11), and State_Invalid(00).

The second field 22 contains the glitch status for the phase. Possible values are True_Glitch(10), False_glitch(01), Glitch(11), and No_Glitch(00).

The third field 24 contains the transition status for that phase. Possible values are Rising(10), Falling(01), Change(11), and No_Change(00).

The fourth field 26 contains the final state of the node as it exits the phase. Possible values are State_High(10), State_Low(01), State_Valid(11), and State_Invalid(00).

Although the 8-bit byte is capable of representing 256 possible timing behaviors, only 33 are used (the 31 shown above plus two special meanings: NoChange and Invalid). All possible encodings other than the 31 (plus NoChange) are marked Invalid and are not used. Note that these 31 states represent all possible meaningful states and values.

A fast, table-lookup method is used to calculate a node's timing behavior. For each primitive logical function (AND, OR, and NOT) a table relates the possible inputs to the function with the resulting outputs. Functions with more than two inputs are calculated using an iterative solution that accumulates the overall response.

Calculation is done independently for each phase of the cycle by table-lookup followed by a cleanup operation (also based on table lookup) that fixes the phase-to-phase boundary conditions.

There are seven lookup tables, one for each of the NOT, AND, OR, SR, SSR, and RSR functions, and one for the cleanup operation. (SSR is a "set-priority SR". RSR is a "reset-priority SR".) The timing behavior for the other standard logic functions (e.g., NAND, NOR, XOR, Multiplexer) can be derived by appropriate Boolean combinations of the basic three primitives (NOT, AND, and OR).

Figure 6:
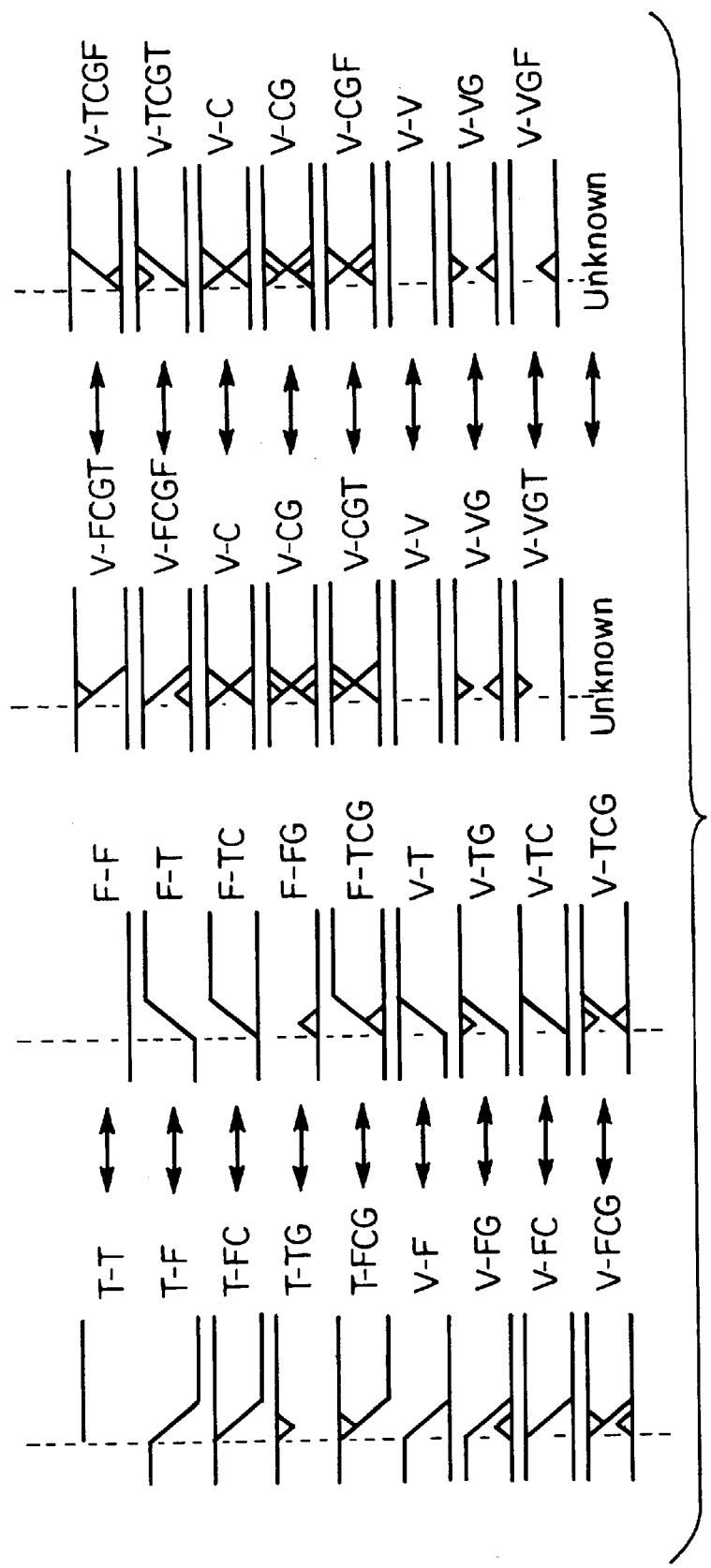

The symmetric (given a "value" as input the table returns its "inversion", and given an "inversion", the table returns its "value") table for the NOT function captures the following information (corresponding timing behaviors are shown graphically in FIG. 6):

| Value | Inversion |
| --- | --- |
| T-T | F-F |
| T-F | F-T |
| T-FC | F-TC |
| T-TG | F-FG |
| T-FCG | F-TCG |
| V-F | V-T |
| V-FG | V-TG |
| V-FC | V-TC |
| F-FCG | T-TCG |
| V-FCGT | V-TCGF |
| V-FCGF | V-TCGT |
| V-C | V-C |
| V-CG | V-CG |
| V-CGT | V-CGF |

-continued

| Value | Inversion |
|---|---|
| V-V | V-V |
| V-VG | V-VG |
| V-VGT | V-VGF |
| Unknown | Unknown |

Note that this table actually represents a symmetric functional relationship which maps each of 31 values (representing timing behaviors) to its inversion. Since there are actually 256 possible behaviors, all others are mapped to an invalid value.

Each of the 31 behaviors has a corresponding logical complement (or inversion) as shown. For instance, a particular phase of an input having a V-F timing behavior will create, for the same phase on the output, a V-T timing behavior. These translations are implemented in a one dimensional array referred to as the NotTable.

The OR lookup-table (the OrTable) may be manually or automatically generated. Automatic generation is simplified (and less error-prone than manual generation) because of the special encodings used. The table is generated as follows:

```
unsigned char value;
    for (row=0; row<=0xff; row++)
        for (col=row; col<=0xff; col++)
            if (row == 0) /* undefined value */
                switch (col) {
                    case 0x82:value =0x82; break; /* make it T-T */
                    case 0xA2: case 0x4A: case 0xCA: case 0xEA:
                        value = 0xEA; break; /* make it V-TG */
                    default: value = 0; break; /* leave it undefined */
                }
            else{
                /* Calculate OR states */
                value = 0x82 & (row & (col <<1) | col & (row << 1)) |
                        0xc3 & row & col;
                */ Calculate the transition status field */
                value | = 0xc & (row | col);
                /*   if initial value is high, then there cannot be a rising
                     */
                    if ((value & 0xc)) == 0x80) value &=0xf7;
                /*   if final value is high, then there cannot be a falling
                     */
                if ((value & 0x3) == 0x2) value &= 0xrb;
                /* Calculate Generated Glitch status fleld */
                value |=(0x8 & (row & (col<<1) | (col &
 (row<<1)))) <<2;
                if (row != 0x82)
                    /* Calculate propagate glitches */
                    value | = 0x30 & (row | col);
                /*   Cleanup glitches that don't make sense, have to
                     enter and leave with same values to have a glitch
                     */
                OrTable[row][col]=0x30 &(value>>2) &(value <<4)&value
                    value & 0xcf;
                OrTable[col][row]= OrTable[row][col];
            /* other half of table */
            }
```

The AND lookup-table (AndTable) may then be automatically derived from the OrTable and NotTable by performing simple de Morgan operations as follows:

```
for(i=0; i <= 0xff; i++) {
        for (j=i; j <= 0xff; j++) {
            AndTable[i][j] = NotTable[OrTable[NotTable[i]][NotTable[j]]];
            AndTable[j][i] = AndTable[i][j]; /* The array is
                symmetric in value */
        }
    }
```

There are three primary functions (one for each of NOT, OR, and AND) that manage the task of performing the lookups for each phase of a cycle:

NOT Calculation:

```
/* compute the complement timing of the array "input" and put
   the result into the array "output" */
void TimingNotCondition (TIMING input[], TIMING output [])
{
 int phase;
    for (phase=0; phase, NumberPhases; phase++) {
        if (input[phase] == Unknown) {
```

-continued

```
            InitTiming(output, Unknown);
            return;
        }
        else
            output[phase] = NotTable [input[phase]];
    }
}
```

AND Calculation:

```
/* compute the AND timing of the arrays "input1" and "input2" and put the result into
   the array "output" */
    void TimingAndCondition (TIMING input1[], TIMING input2[],
        TIMING output [])
    {
       int phase;
       for (phase=0; phase < NumberPhases; phase++){
          output[phase] = AndTable[input1[phase]][input2[phase]];
          if (output[phase] == Unknown) {
              InitTiming(output, Unknown);
              return;
          }
       }
    }
}
```

OR Calculation

```
/*  compute the OR timing of the arrays "input1" and input2" and put the result into
    the array "output" */
    void TimingOrCondition(      TIMING input1[], TIMING input2[],
                                 TIMING output [])
    {
       int phase;
       for (phase=0; phase < NumberPhases; phase++) {
          output[phase] = OrTable[input1[phase]][input2[phase]];
          if (output[phase] ==Unknown) {
              InitTiming(output, Unknown);
              return;
          }
       }
}
```

The following is an example routine for the InitTiming function (used above) which sets all of the timing behavior memory to the same constant value.

```
/*
 *InitTiming procedure puts the single phase timing
 * specified into all phases of the timing system.
 */
InitTiming (TIMING output [], TIMING value)
```

-continued

```
{
   for (phase = 0; phase < NumPhases; phase ++)
      output [phase] = value;
}
```

The following routine, Generate_SR_Table, generates the tables for the set-reset (SR), set-priority set-reset (SSR), and reset-priority set-reset (RSR) logic. It is normally called once to pre-calculate the three two-dimensional arrays, ssr_cond, rsr_cond, and sr_cond, and used for subsequent timing calculations of a circuit's network.

Generate_SR_Table()

```
{
    for (set = 0x00; set <=0xFF; set++)
    {
        for (reset = 0x00; reset <= 0xFF; reset++)
        {
            if ((set !=0x00) && (reset !=0x00))
        {
        /* Compute initial state value:
        SSR initial table    RSR initial table    SR Initial table
             S                    S                    S
           H L V                H L V                H L V
```

|   | H | L | V |
|---|---|---|---|
| H | H | L | V |
| R L | H | V | V |
| V | H | V | V |

|   | H | L | V |
|---|---|---|---|
| H | L | L | L |
| R L | H | V | V |
| V | V | V | V |

|   | H | L | V |
|---|---|---|---|
| H | V | L | V |
| R L | H | V | V |
| V | V | V | V |

```
            after boolean reduction: */
                ssr_value = 0xc0 & (set | (reset << 1) & 0x80));
                rsr_value = 0x0 & ((reset << 1) & 0x80 |
        ((reset >> 1) | set) & 0x40);
                sr_value = 0xc0 & (set | (reset << 1) & 0x80 |
                    (reset >> 1) & 0x40);
        /* compute the final state value:
        SSR final table      RSR final table      SR final table
             S                    S                    S
           H L V                H L V                H L V
```

|   | H | L | V |
|---|---|---|---|
| H | H | L | V |
| R L | H | * | * |
| V | H | * | * |

|   | H | L | V |
|---|---|---|---|
| H | L | L | L |
| R L | H | * | * |
| V | V | * | * |

|   | H | L | V |
|---|---|---|---|
| H | V | L | V |
| R L | H | * | * |
| V | V | * | * |

|   | S |   |
|---|---|---|
|   | L | V |

|   |   |   | Init |
|---|---|---|------|
| L | Init | OR |   |
|   |   | H |   |

R  Where "Init" is the intial state value

|   | Init |   |
|---|------|---|
| V | OR | V |
| L |   |   |

```
            after boolean reduction yield:                */
                ssr_value |= (set | (reset << 1) & (ssr_value >> 6)) & 0x2 |
                    (set & (ssr_value >> 6) | (reset >> 1)) & 0x1;
                rsr_value |=((reset << 1) & (set | (rsr_value >> 6 &0x2) |
                    ((reset >> 1) | set & (rsr_value >> 6)) & 0x1;
                sr_value |= (set | (reset << 1) & (sr_value >> 6)) & 0x1;
            /*
            If the set is rising, the result can rise for all flavors. The same is true if the
            reset is rising. We count on CleanTransition( ) to remove any transitions
            that aren't possible.
            */
            ssr_value |= (set & 0x8) | (reset & 0x4);
            rsr_value |= (set & 0x8) | (reset & 0x4);
            sr_value |= (set & 0x8) | (reset & 0x4);
            /*
            This section handles the case when the controlling input is changing. In
            the first case, if set is possibly falling, and reset doesn't end low, the
            output can fall due to the effect of the reset signal. However, this is not
            true in the case of the RSR because the reset was already the controlling
            input.
            The similar case is true for reset falling.
            */
            ssr_value |= (set & (reset << 1) & 0x4);     /* extra reset */
            rsr_value |=((reset << 1) & (set << 2) & 0x8); /* extra set */
            /*
            Cleanup the transitions, a rise cannot exist unless the signal had a low or
            valid initial condition and ends with a high or valid final condition. The
            opposite is true for fall conditions
            */
            ssr_value &= (0xf3 |
                    (ssr_value << 2) & ((ssr_value >> 3) & 0x8 |
                (ssr_value >> 5) & 0x4);
            rsr_value &= (0xf3 |
                    (rsr_value << 2) & ((rsr_value >> 3) & 0x8 |
                (rsr_value >> 5) & 0x4);
```

-continued

```
        sr_value &= (0xf3 |
                (sr_value << 2) & ((rsr_value >> 3) & 0x8 |
            (sr_value >> 5) & 0x4);
        sr_cond[set][reset] = sr_value;
        ssr_cond[set][reset] = ssr_value;
        rsr_cond[set][reset] = rsr_value;
      }
      else
      {
        ssr_cond[set][reset] = 0x00;
        rsr_cond[set][reset] = 0x00;
        sr_cond[set][reset] = 0x00;
      }
    }
  }
}
```

Calculation of an arbitrary combinatorial logic function requires recursive evaluation, beginning with the inputs of the function and evaluating each part of the function until the complete function's timing behavior is known. For example, for a complex AND-OR function, the timing behavior for the AND part is determined first, and these intermediate results are used as inputs to the computation of the OR function's timing behavior.

The following example illustrates a simple function (OR) that contains subfunction results (AND). Implementation of a program to recursively evaluate these complex functions with sub-functions requires an additional routine to get the equivalent input or sub-expression timing behavior of the current function. An example of this additional routine is demonstrated below:

```
typedef struct function *pFunction;
typedef struct function{
        char function_code;    /* encoded function code */
        pFunction sub_function; /*    pointer to sub-function
            if primary_input = false */
        pNode input_Node;     /* pointer to input node
            if primary_input = true */
        pFunction next;    /* next function entry at this level */
} Function;
    void Get Condition (pfunction fptr, TIMING output [])
    {
        char phase;
        TIMING temp1[NumberPhases],
    temp2[NumberPhases],
    temp3[NumberPhases];
        pFunction sub;
        switch(ftpr->function_code) {
          case primary_input:
            for (phase=0; phase < NumPhases; phase++)
                output[phase] = fptr->input_node->condition[phase];
            break;
          case OR_function:
            GetCondition(fptr->sub_function, output);
            /* get behavior of first input */
            for (sub=fptr->sub_function->next;
        sub;
        sub=sub->next) {
                GetCondition(sub,temp1);/* get behavior
    of subsequent input */
                TimingOrcondition(output,
    temp1,
    output); /* OR them together */
            }
            break;
          case AND_function;
            GetCondition(fptr->sub_function, output);
            /* get behavior of first input */
            for (sub=fptr->sub_function->next;
        sub;
        sub=sub->next) {
                GetCondition (sub, temp1); /* get behavior of
    subsequent input */
                TimingAndCondition(output, temp1, output);
                    /* AND them together */
            }
            break;
          case NOT_function:
            GetCondition fptr->sub_function, output);
            /* get behavior of first input */
            TimingNotCondition (output, output) /* complement it */
            break;
          case NAND_function:
            Getcondition (fptr->sub_function, output);
            /* get behavior of first input */
            for (sub=fptr->sub_function->next;
        sub;
            sub=sub->next) {
                GetCondition (sub, temp1);
                /* get behavior of subsequent input */
                TimingAndCondition (output, temp1, output);
                /* AND them together */
            }
            TimingNotCondition (output, output);
            /* complement the output */
            break;
          case NOR_function:
            GetCondition(fptr->sub_function, output);
            /* get behavior of first input */
            for (sub=fptr->sub_function->next;
        sub;
    sub=sub->next) {
                Getcondition (sub, temp1);
                /* get behavior of subsequent input */
                TimingAndCondition(output, temp1, output);
            /* AND them together */
            }
            TimingNotCondition(output, output);
        /* complement the output */
            break;
          case XOR_function:
            GetCondition(fptr->sub_function, temp1);
            /* first input */
            GetCondition(fptr->sub_function>next, temp2);
            /* second input */
            TimingNotcondition(temp2, temp3); /*t3 = not in t2 */
            TimingAndCondition(temp1, temp3, output);
            /* output = in1 & not in2 */
            TimingNotCondition(temp1, temp3); /* t3 = not in t1 */
            TimingAndCondition(temp3, temp2, temp3);
                /* t3 = not in1 & in2 */
            TimingOrcondition(temp3, output, output);
            /* output =in1 & not in2 | not in1 & in2 */
            break;
        }
}
```

Timing behavior calculation for other non-combinatorial logic functions, e.g., functions with memory, require additional algorithms and methods to properly calculate and propagate timing behaviors. Memory-type functions depend upon their previous output value in their current behavior calculation. For example, the user has to know its previous timing behavior to calculate the timing result of a latch. The circular problem of calculating the timing behavior of two such memory elements is solved algorithmically.

The timing behavior for a simple single-port latch is calculated using a method best described in the following pseudo-code segment:

```
for(i - 1; i <= NumberPhases, i++) {
    if (Clock could be High) output (i) = V-C;
                    /* assume
the output changes */
    else if (Clock could already by High) output (i) = DataInput (i);
        /* otherwise the output does not change */
}
cleanup (output)
```

The final cleanup process propagates the correct logical data value to other output phases that were not assigned in the flow (i.e., those cases that hit the otherwise situation).

The following procedure, Clean_Condition, is a representative example of the timing cleanup operation that occurs after computing the whole timing behavior for all nodes.

/*

This loops around all of phases, starting with phase one, making sure that the phase boundaries match. (e.g., A signal doesn't end phase 1 true and start phase 2 valid.) The timing of the preceding phase has priority and overrides the subsequent phase's condition.

*/

Clean_Condition (TIMING output [])
{
/*

Break out early to avoid an infinite loop below.

The redo_flag is used to propagate a single phase's worth of information through a remaining cycle of TIM_UNKNOWNs, until an entire loop is traversed without finding a prev_cond== TIM_UNKNOWN. A consequence of this is that if the entire cycle is composed of TIM_UNKNOWNs causes infinite looping.

```
*/
            count = 0;
            for (this_phase = 0; this phase < NumPhases; this_phase++)
                    if (output [this_phase] == 0) count++;
            if (count == NumPhases)
                    return;
do
{
            redo_flag = FALSE;
            for (this_phase = 0; this_phase < NumPhases; this_phase++)
            {
                    /* calculate the previous phase number */
                    if (this_phase == 0)
                    prev_phase = NumPhases - 1;
                    else
                    prev_phase = this_phase - 1;
                    final_state_changed = FALSE;
                    if (output (prev_phase) ==0)
                    redo_flag = TRUE; /* have to recirculate again */
                    else
                    {
                    if (output [this_phase] == 0)
                            /*
                            If this phase was previously unknown set its beginning and
                            ending states to the previous final state, and remove all
                            glitches and transitions.
                            */
                            temp = output [prev_phase] & 0x3; /* previous final */
                            temp | = (temp << 6); /* start and final */
                            output [this_phase] = temp;
                            final_state_changed = TRUE;
                    }
                    else
                    {
                    /*
                    Make the previous final condition the current phase's initial
                    condition, cleaning up any glitches and phase changes that may
                    no longer make sense.
                    */
                    temp = output [prev_phase] << 6;    /*initial state*/
                    /* recompute the glitch field */
                    temp | = (output[this_phase] & (output[prev_phase] << 4)
            & 0x30);
                    /* recompute the rise field */
                    temp | = (output[this_phase] & (output[prev_phase] << 3)
                            &0x8);
```

```
            /* recompute the fall field */
            temp | = (output[this_phase] & (output[prev_phase] << 1)
                    & 0x4);
            /* recompute the final state field */
            temp | = (output[this_phase] & ((temp >> 2)
                    & output[prev_phase]) & 0x3);
            if ((temp & 0x3) != (output[this_phase] & 0x3))
                final_state_changed = TRUE;
            output[this_phase] = temp;
        }
        /*
        Set the redo_flag if we reached the last phase and changed the final state.
        We will have to start over to propagate this state to the first phase.
        */
        if ((this_phase == NumPhases - 1) && (final_state_changed))
            redo_flag = TRUE;
        }
      }
    }
    while (redo_flag);          /* End of do loop */
}                               /* END Clean_Condition */
```

Set/Reset type functions may be of three types:

1. output is undefined if both Set and Reset inputs are simultaneously on;
2. output is always logical low ("0") if both Set and Reset are simultaneously on (classified as Reset priority, Set/Reset latches);
3. output is always logical high ("1") if both Set and Reset are simultaneously on (classified as Set priority, Set/Reset latches);

Propagation of the timing behaviors is accomplished by several different algorithms and methods. Timing generation generally begins with the designer supplying a timing seed on all inputs of the design. Then the process flows progressively:

a. calculates a logic function's timing behavior;
b. if a valid timing was created, then propagates to subsequent functions using the new calculated output as an input;
c. refines the timing information to the best possible result until convergence.

DETECTING LOGICAL NON-USAGE

A simulator evaluates each logic function in a design each time any one of its inputs change. Sometimes, the newly calculated value simply is ignored by subsequent logic. This is particularly true for some compile-mode logic simulators that pre-schedule evaluation at compile time rather than performing real-time logic evaluation during execution. In this invention we take advantage of this observation in order to reduce the size of the circuit model. The concept of observability "don't-cares" has been used in logic simplification tools to reduce logical implementation of desired behaviors. In this invention the concept of observability "don't-cares" is applied to a synchronous model with determined timing behaviors to minimize logic and transform certain elements to simpler representations.

Consider an example using standard complementary logic that has multi-clock based inputs, and has a later single-clock based logical fan-out. Referring to FIG. 6A, for example, the logical OR 40 of two latches 42, 44 that are triggered on different clocks p1, p2, results in two successive evaluations by the simulator of the OR's output (Z), one triggered by p1, the other by p2; this is appropriate in terms of the logic. But suppose the only place output Z goes is into a latch 46 which is clocked at time p3, such that the output of latch 46 depends only on the more recent evaluation of Z (the one triggered by p2). It is possible, of course, that the output of latch 46 may be a value that was created in the earlier (p1) evaluation of Z at time 48; this Z value may still be valid from what would have been the previous transition. Although the OR's first evaluation is not necessary for total functional behavior equivalence, it is necessary for the correct timing behavior description. The fact that it is unnecessary for functional behavior equivalence is indicated by the system marking output Z simulation phase A8 as being "unimportant", i.e., it is ignored by subsequent logic as long as the evaluation at P2 is performed.

The "unimportant" or "don't-care" information is only relevant to compiled-mode logic simulation. In compiled-mode simulation, the second evaluation will always be performed. Normally, the actual implementation of the logic requires both of the evaluations. Thus, no generic reduction or simplification of the implemented logic may be achieved. The gate (or logical function) itself is required and necessary. The extra evaluation A8 (which takes simulation time) is an extra evaluation of that function, provided that the following evaluation at P2 is always performed.

Another example is a logic signal with at least one constant valued-phase followed by an evaluate-sample phase, e.g., a complementary logic function implemented in high-performance CMOS designs known as precharge logic.

Referring to FIG. 7, signal S1 is a constant logical 1 in phase p2 (precharged in phase p2), and can change value in phase p3. The function's operation can be modeled as a SET/RESET memory element 60 (see table below). If the SET input is a 1, then the output Q is also a 1. If the RESET input is a 1, then the output Q is a 0. If both SET and RESET are 0, then Q holds its previous value. If both SET and RESET are both 1, then the value of Q is undefined. (The latter case is not further considered here.)

| Set | Reset | Q (t + 1) | Comments |
|---|---|---|---|
| 0 | 0 | Q (t) | No change |
| 0 | 1 | 0 | Clear |
| 1 | 0 | 1 | Set |
| 1 | 1 | Undefined | Not allowed |

Figure 8:
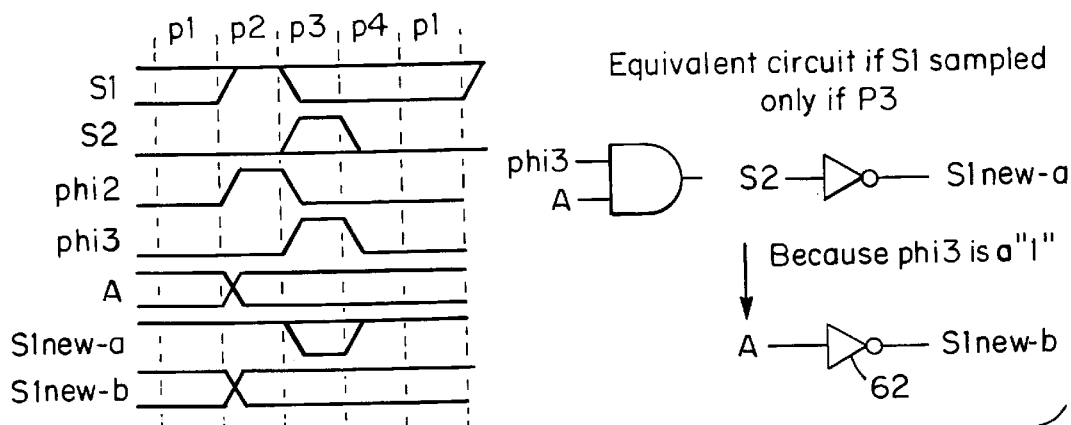

Assume that S2 is the RESET signal that conditionally changes the value of S1 to a 0 in phase p3. If S1 is sampled by its logical fan-out only in phase p3, then the precharge operation (in phase p2) on S1 can be eliminated, as seen in FIG. 8. Further analysis of the signal S2 shows that for the phase in which we are interested, phase p3, clock phi3 only enables input A, and does not add information. Due to phi3 being constant during phase p3, the logical equivalent 62 has no clocks, as is shown in FIG. 8.

This is a special case which produces a logic equivalent circuit that is both correct for compile-mode logic simulators, and may be used to replace the original circuit's functionality in an actual implementation. In FIG. 8, the logical equivalent circuit 62 eliminates the memory state element and replaces it with a simpler standard complementary function. This equivalent function has a different timing behavior than does the original circuit, but for the constraints assumed, will logically behave identically to the original circuit.

If, however, node s1 is sampled by any fan-out in any other phase, then the precharge value is important and the original circuit has to be maintained intact. This is an example where correct modelling of memory state across multiple phases is required.

The identification and replacement of memory elements as in FIG. 8 by equivalent non-memory elements aids enhanced static verification techniques of the kind that perform alternative analyses based on classification of signals and circuits as memory or non-memory. Falsely classifying non-memory elements as memory elements decreases efficiency of static analysis. It results in too many falsely produced static checks. These create additional work for the circuit designer in filtering the results.

The replacement of memory elements by equivalent non-memory elements is also important for improving the automatic abstraction of simplification of logical intent from actual implementation details. Logic abstraction is important for improvements to static analysis techniques, logic simulation performance, and re-synthesis of existing designs into different implementation technologies.

In one implementation of the invention, "Needed" and "Fully-used" states of a signal are captured (during the logic abstraction process, after the timing behaviors of the design have been determined) as fields in a data structure associated with each signal (as shown in the following table). (Again, usage has two purposes: compiled-mode logic simulation evaluation optimization, and abstracted logic usage for other static analysis techniques that are being developed.) The "Fully_used" and "Needed" states are cleared (unmarked) during initial processing of the circuit network. There is one Needed state bit for each phase (where phase corresponds to circuit operational phase) of the design (e.g., four Needed state bits per node for a four phase design), and one Fully_used state per node.

The following demonstrates a data structure containing these two states:

```
TYPEDEF struct {
    ...
    char timing(NUM_PHASES); /*
                                storage for the timing
                                behavior of the signal.
                                There is one byte for each
                                possible phase in the
                                design. Each byte will hold
                                one of 31 different values
                             */
    char needed(NUM_PHASES); /*
                                These are the "needed"
                                state bits, one per phase of
                                the design
                             */
    char fully_used;         /* This is the fully_used state for the signal */
    ...
} SIGNAL;
```

Figure 12:
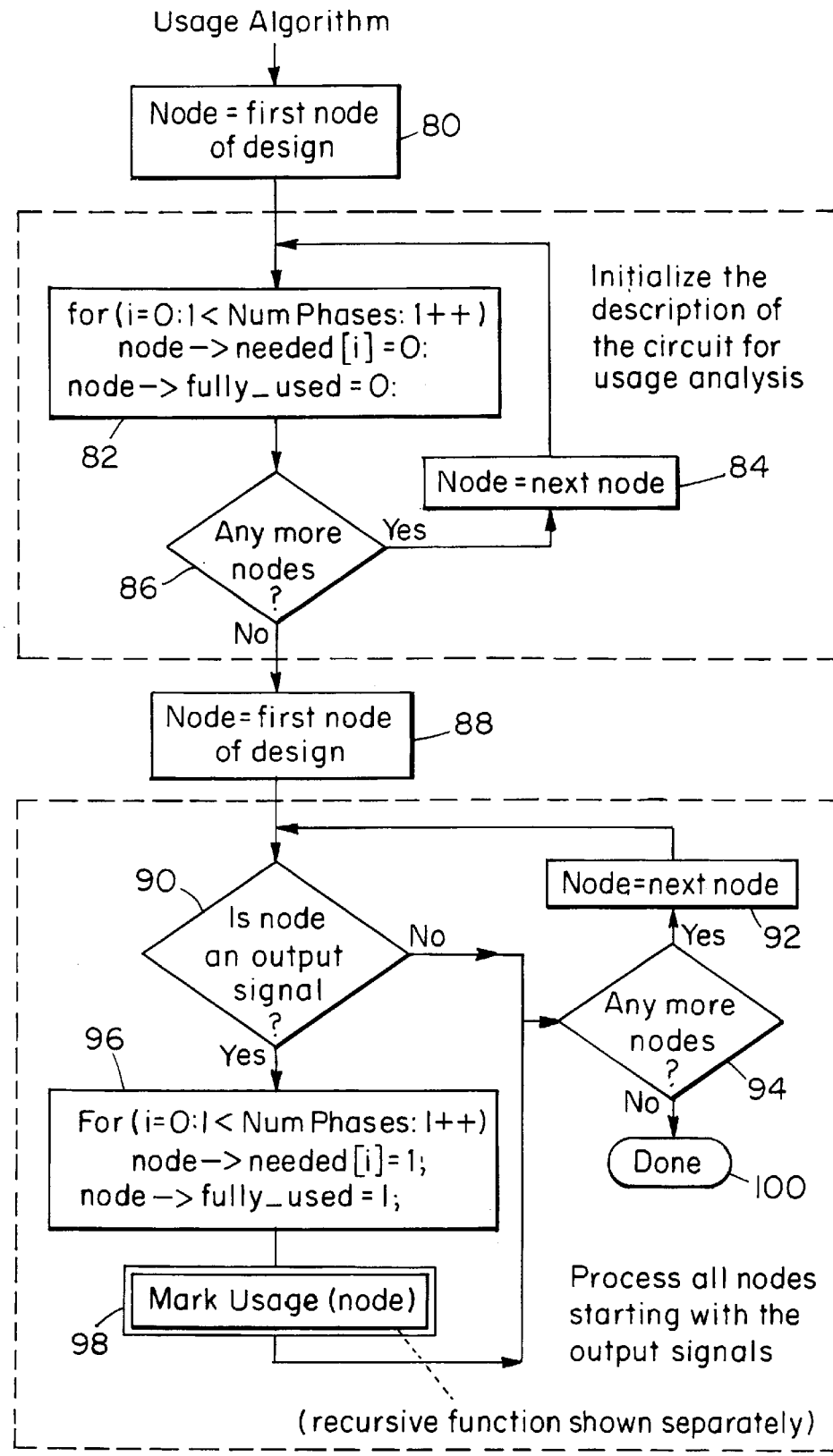
FIGS. 12 through 15b are flow diagrams.

The basic steps of the algorithm that determines the logical usage of each signal in an overall circuit follow (these steps are also shown in detail in the flow chart of FIG. 12 which describes the usage algorithm):

Step 1. Clear the Needed and Fully_used state information for every node in the circuit.

Step 2. Mark all phases $p_j$ of the cycle for all of the output signals as Needed. (This guarantees that the original timing behavior is kept for these signals for all phases of the design.)

Step 3. For certain output signals $OUT_P$ pre-identified by a user:

Step 3.a. Mark the signal as Fully_used. (A node can be fully_used without being needed in every phase. The fully_used information is useful in the extreme case when all needed bits are cleared, i.e., set to 0, but the node has been processed by all of its fanout. In this special case, the bit is needed to indicate this fact and to indicate that the node is totally useless in the design for the declared outputs.)

Step 3.b. Logically evaluate each phase $p_j$ of the function that feeds that output, looking for input timing behavior that serves to enable or block operation of the function. For each blocking dominant input (defined below) in a phase, mark that input signal Needed for that phase. For each enabling or enabled input, also mark those input signals Needed for that phase.

If the outputs of a function are totally dependent upon a single input, and other inputs can be ignored, then that single input is a blocking dominant input. For example, a single logical "0" into an AND function dominates the output with a "0" result, independent of any other input's value. Enabling inputs are such that they allow other inputs to influence the function's output result. For instance, a logical "1" into an AND function will enable all other inputs.

Step 3.b. requires phase-by-phase evaluation of the Boolean function that drives the particular output. A logical output function may be a simple single-stage logic function like NAND, NOR, OR, AND, or INVERT, but it may also be a more complex function with multilevel logic functions, or a memory state implemented with Set/Reset and data latches.

The solution is a recursive table-driven approach which looks for dominant operations for Needed output phases:

timing behaviors that result in a constant Boolean value ("1" or "0") for the particular phase. If found, then processing continues recursively following the input chain that creates the dominant input, eventually marking one or more inputs to the complete function as Needed. Functions that aren't dominated by a single input continue recursively down each input marking them as Needed.

There are two process flows. The first is a table lookup technique for combinatorial logic functions; the second is for memory state elements.

Each combinatorial function allows a decision based upon the effective timing behavior of the function for a particular phase, as is shown in the following tables:

| Function | t-t<br>t-tg | t-fc<br>t-fcg | f-f<br>f-fg | f-tc<br>f-tcg | v-t<br>v-tg<br>f-t |
|---|---|---|---|---|---|
| Invert | A | A | A | A | A |
| AND | A | A | C | A | A |
| OR | B | A | A | A | B |
| NAND | C | A | A | A | C |
| NOR | A | A | B | A | A |
| XOR | A | A | A | A | A |

| Function | v-f<br>v-fg<br>t-f | v-c<br>v-cg<br>v-cgt<br>v-cgf | v-v<br>v-vg<br>v-vgt<br>v-vgf | v-fc<br>v-fcg<br>v-fcgt<br>v-fcgf | v-tc<br>v-tcg<br>v-tcgt<br>v-tcgf |
|---|---|---|---|---|---|
| Invert | A | A | A | A | A |
| AND | C | A | A | A | A |
| OR | A | A | A | A | A |
| NAND | A | A | A | A | A |
| NOR | B | A | A | A | A |
| XOR | A | A | A | A | A |

A - All inputs are needed. Using the table, re-evaluate the next nested function for each input of the function, or mark the inputs as Needed.
B - Dominant "1" input exists. Using the table, reevaluate the next nested function of the inputs which create a constant "1", or mark the inputs which have constant "1" as Needed.
C - Dominant "0" input exists. Using the table, reevaluate the next nested function of the inputs which create a constant "0", or mark the inputs which have constant "0" as Needed.

Step 3.c. After all phases of the output function have been evaluated, revisit all input signals, checking the state of each of the fan-outs of the input functions that drove the selected output $OUT_i$. If every fan-out function using this input is marked Fully-used, then recursively treat this signal as a new output signal, and continue with step 2 for this output.

If one or more fan-out functions using this input signal is not yet marked Fully-used, then process the next output node of step 2.

The procedure requires pre-identification, in step 3.a, of those outputs in the circuit that require original timing behavior. The user identifies one or more signals considered to be important outputs of the circuit. Some may be internal to the circuit and have other circuit fan-out; others may be outputs of functions that do not have other circuit fan-out. Any signal in the circuit that can logically influence one of these identified outputs will be considered as possibly useful in the circuit. Any signal that does not influence one of these identified outputs ultimately will be eliminated from the design by this complete process. Pseudo-code for this step follows:

```
struct outsig{
        SIGNAL *sig;
        struct outsig *out_next;
        } *outp, *out_list;
/* for all of the output nodes identified by the user */
for (outp = out_list; outp; outp = outp->out_next)
        /* set all of the needed bits for each phase in the cycle */
        for (phase = 0; phase < 4; phase++)
                outp->sig->needed(phase) = 1; /* mark needed */
```

Figure 9:
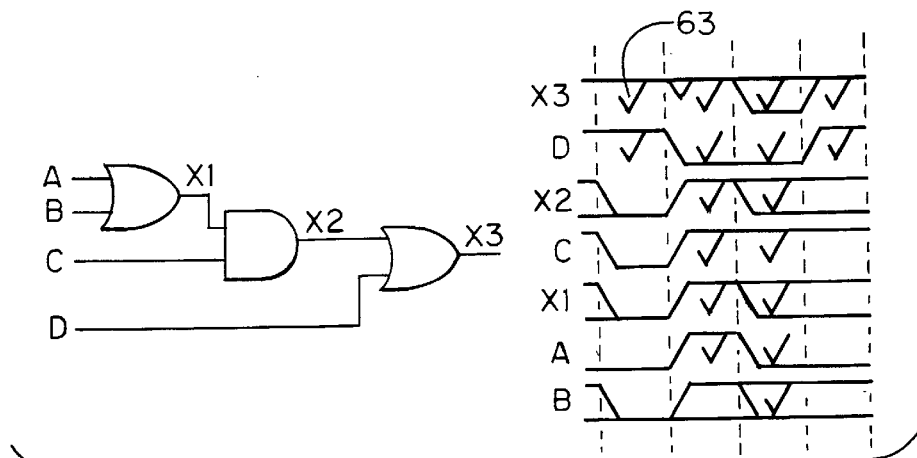

For example, referring to FIG. 9, the output X3 of a simple combinatorial circuit initially has all of its phases marked Needed (indicated by the checkkmarks 62). The evaluation of each phase for X3 (using the tables set forth above) follows:

1. Phase 1, the output is a "1". Inputs to the OR gate function which have a "1" constant are marked Needed. In this example, input D is Needed and is marked (FIG. 9). All other inputs are not marked, and are "don't care" values.

2. Phase 2, the output is a "1" with a glitch. This is similar to the Phase 1 result, but now the dominant input is X2 (we do not care about.the glitch for logic simulation).

3. Phase 3, the output could remain "1" or conditionally transition to a "0". Here all inputs to the OR function are Needed, in this example, both D and X2.

4. Phase 4, the output is a "1". This is the same as Phase "1" result.

Node X2 is then processed as follows:

1. Phase 1, output is not needed, no further processing.

2. Phase 2, output is Needed, and is a constant "1". Therefore, all inputs to the AND gate have to be constant "1"s, and all are Needed. In this case, both X1 and C are Needed.

3. Phase 3, output is Needed. In this case, both X1 and C are Needed.

4. Phase 4, output is not needed, and no further process of X2 occurs.

Notice that the Phase 1 value on node C is ignored in this example. This means that a constant "1" could replace C permanently without affecting the function of the circuit.

The final function to be evaluated is at node X1, evaluated as follows.

1. Phase 1, output is not needed.

2. Phase 2, output is constant "1" so all inputs that have a constant "1" are Needed. In this case, input A is Needed.

3. Phase 3, the output is not dominated by any one input. Therefore, all inputs are Needed. In this case, both A and B are Needed.

4. Phase 4, not needed.

As can be seen from this example, two of the three possible transitions on node B can be ignored in compile-mode simulation. Only the phase 3 result on B is important to the operation of the circuit.

Figure 13:
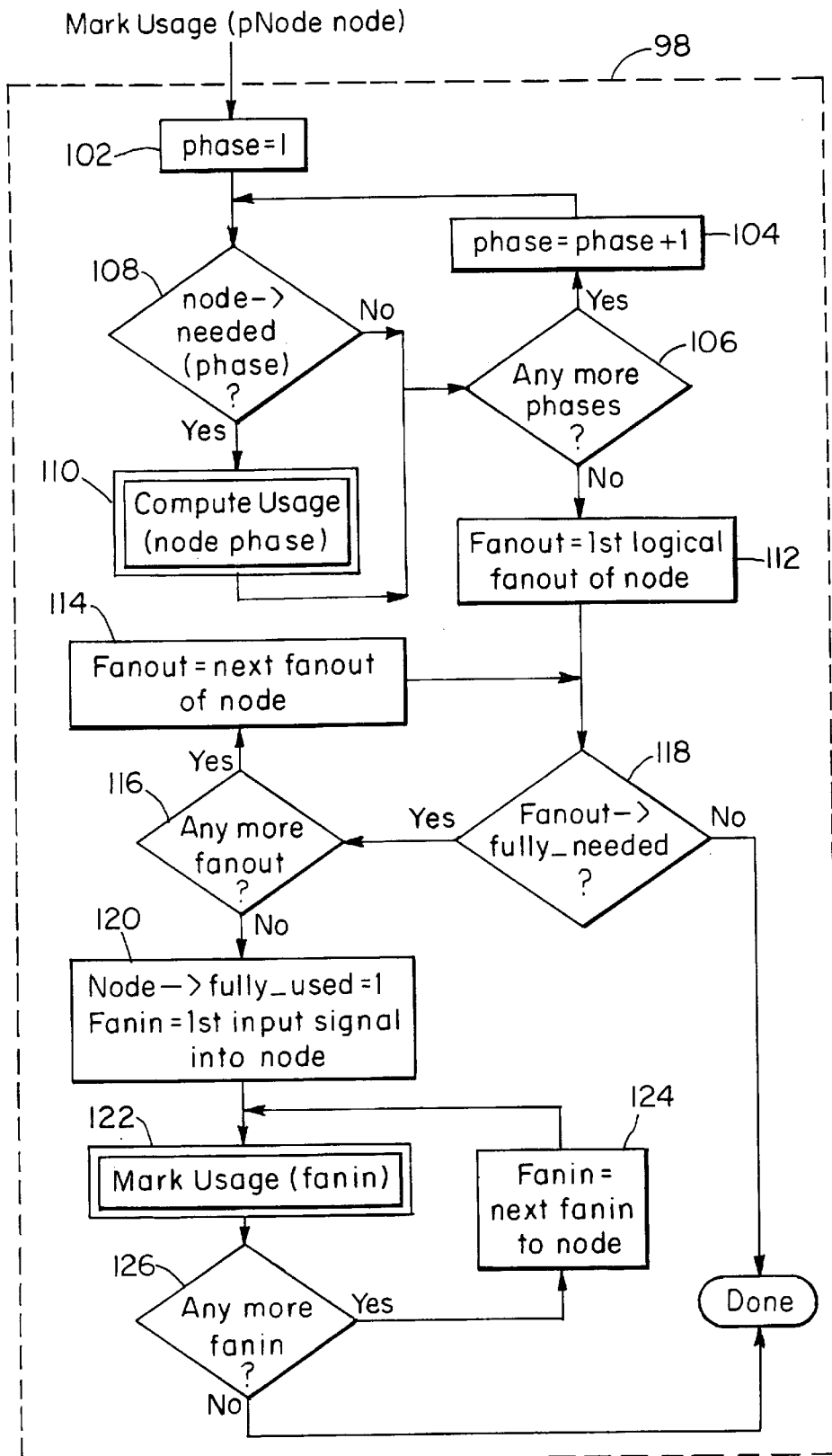
Figure 14:
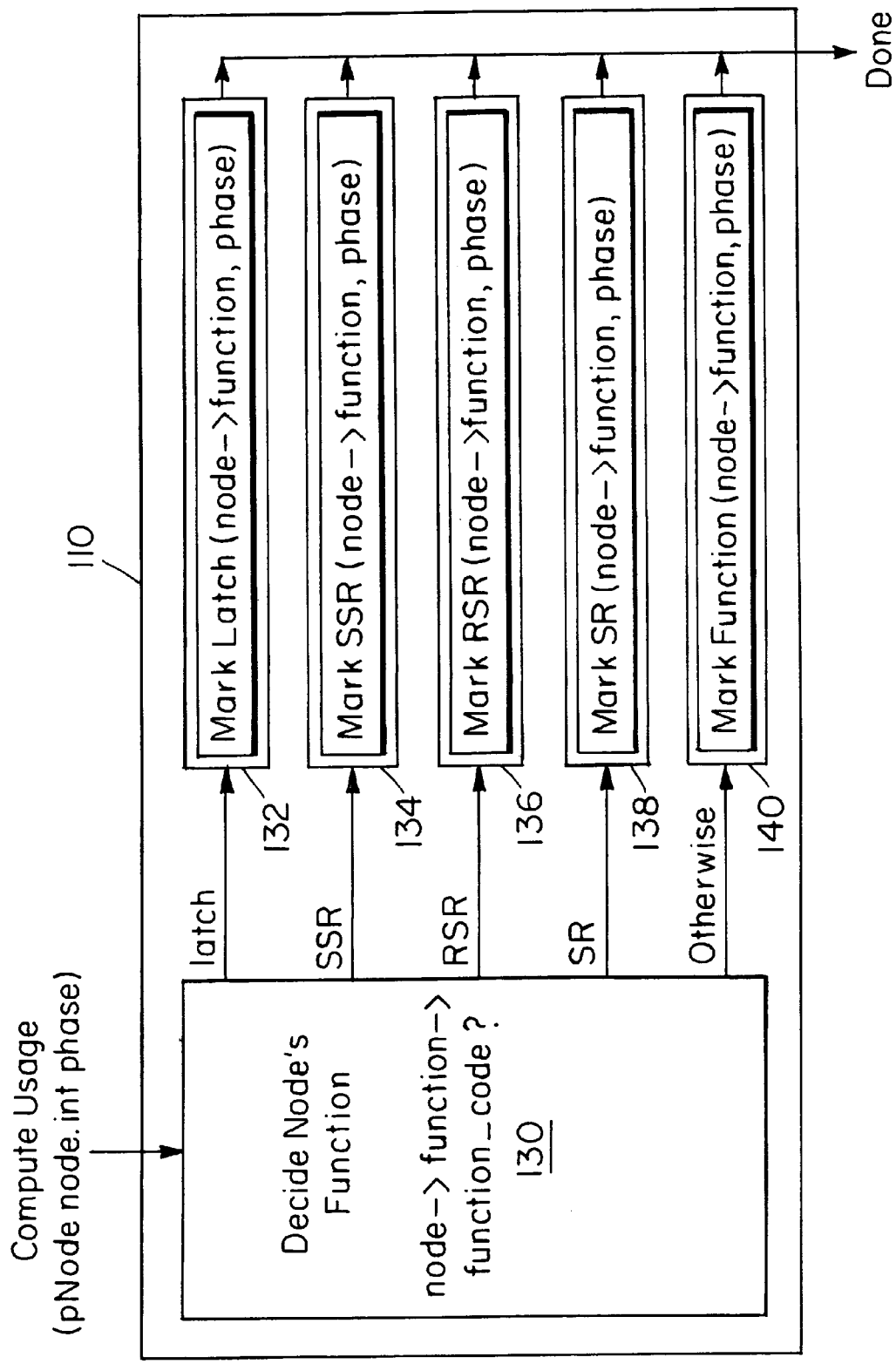

Referring again to FIG. 12, the "Usage algorithm" uses a recursive function MarkUsage 98 to mark all nodes which are output signals. Referring to FIG. 13, function MarkUsage 98 calls function ComputeUsage 110 if the node is needed in the current phase 108. At step 122 it calls itself recursively on the fanin for the node. Function Compute-Usage (called at step 110 in FIG. 13) is described in FIG. 14. Referring to FIG. 14, ComputeUsage 110 decides the node's function 130, and, based on that determination, calls the corresponding procedure 132–140. If the node's function is a latch ComputeUsage calls MarkLatch 132, for an SSR it calls MarkSSR 134, for an RSR it calls MarkRSR 136, for an SR it calls MarkSR 138, otherwise it calls procedure Markfunction 140.

```
        The code for MarkSSR 134 is shown below:
        set_func = function->sub_function->next; /* set function pointer */
        reset_function = function->sub_function;
                    /* reset function pointer */
        MarkFunction(set_func, phase);          /* set input is needed */
        MarkFunction(reset_func, phase);        /* reset input is needed */
        The code for MarkRSR 136 is shown below:
    set_func = function->sub_function->next; /* set function pointer */
reset_function = function->sub_function;
                    /* reset function pointer */
MarkFunction(set_func, phase);      /* set input is needed */
MarkFunction(reset_func, phase);    /* reset input is needed */
        The code for MarkLatch 132 is as follows:
        GetCondition(function, output);
        clock_func = function->sub_function;
        data_func = function->sub_function->next;
        this_timing = output(phase);
        if (this_timing is "changing")
                MarkFunction(data_func, phase); /* Mark data function needed */
        MarkFunction(clock_func, phase); /* Clock function always needed */
        The code for MarkSR 138 is as follows:
        set_func = function->sub_function->next; /* set function pointer */
        reset_function = function->sub_function;
                    /* reset function pointer */
        MarkFunction(set_func, phase);          /* set input is needed */
        MarkFunction(reset_func, phase);        /* reset input is needed */
```

Figure 15A:
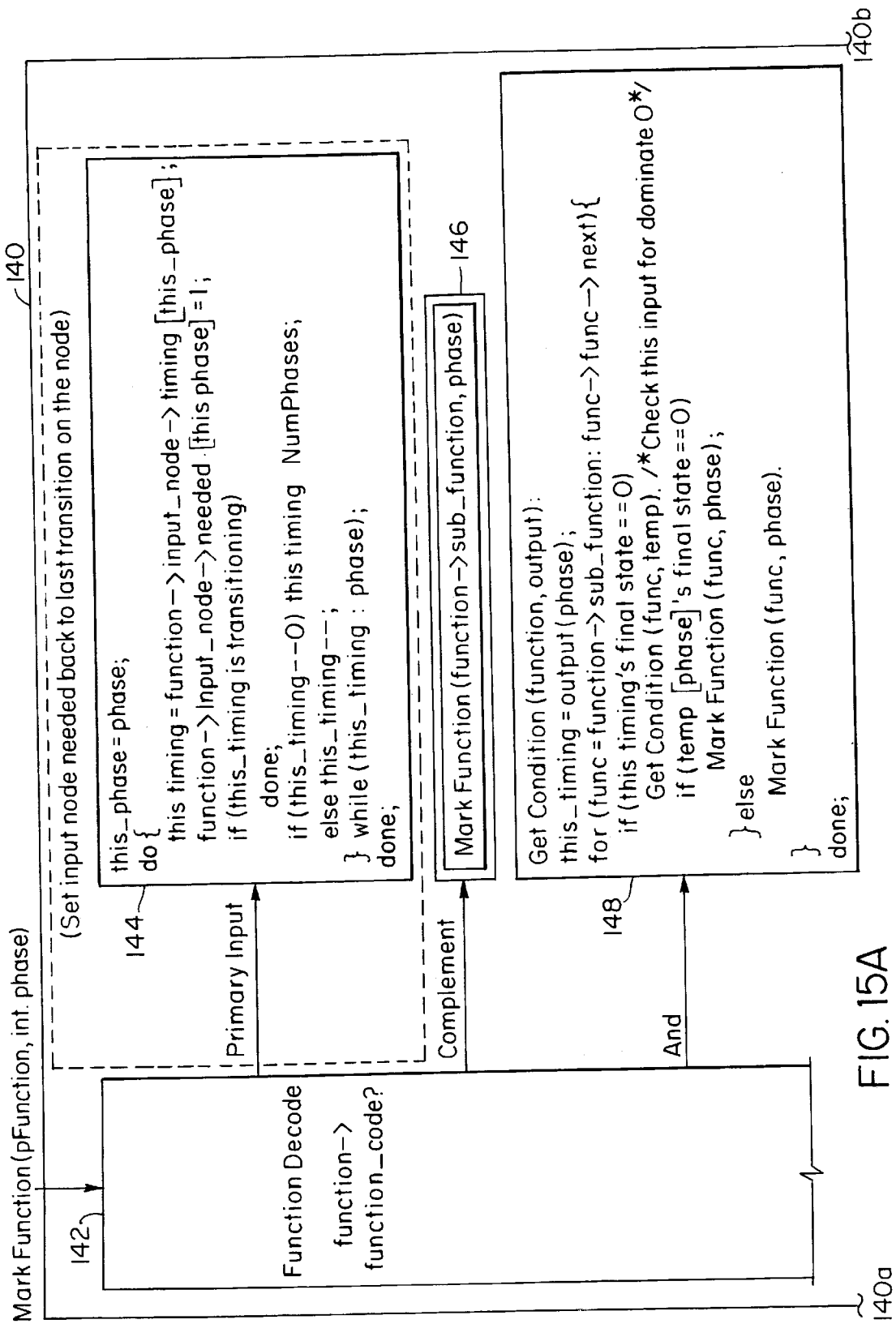
Figure 15B:
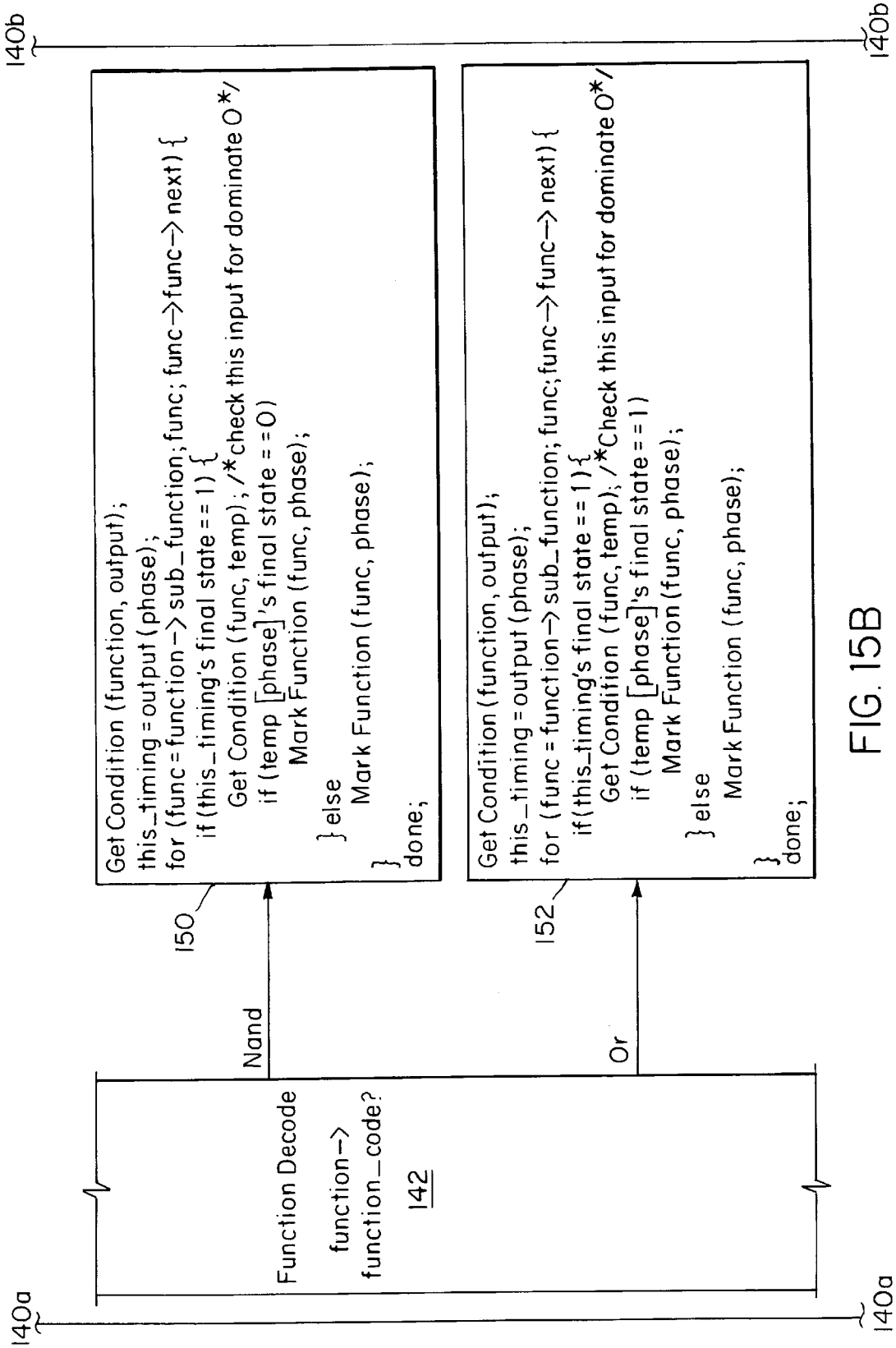
Figure 15C:
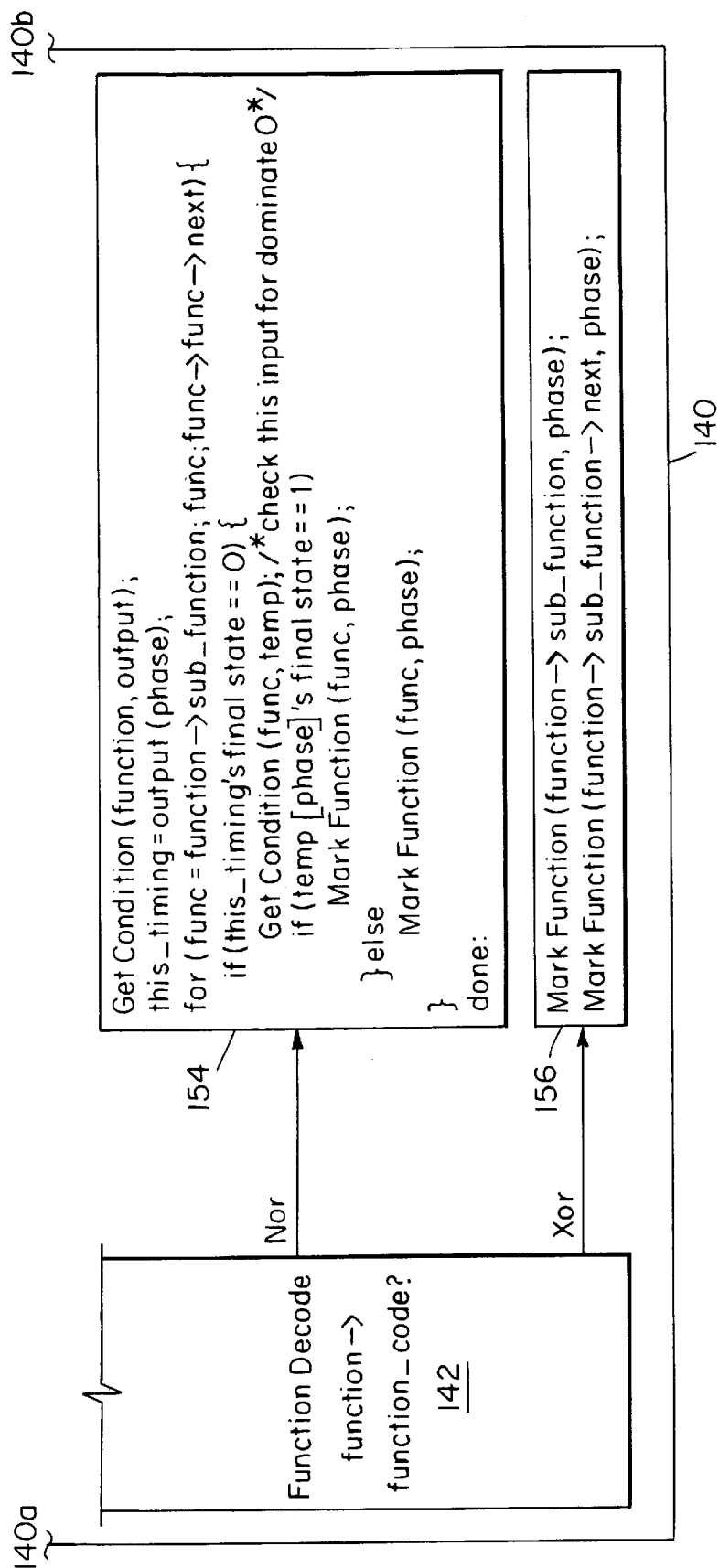

Referring to FIGS. 15a–15b, recursive procedure Mark-Function 140 determines the type of function it is dealing with 142. Based on this determination it performs one of a number of steps 144–156.

The use of procedure computeusage requires additional description of a node's characteristics, mainly the function that influences node's logical operation. The flow charts shown assume the underlying node definition structure:

```
typedef char TIMING;    /* TIMING in this example is a single byte */
typedef struct Node *pNode;
typedef struct Node(
        ...
        char *name;                 /* points to the "name" of the node */
        pNode next_node;            /* next node in the circuit network */
        pFunction function;  /* this node's logical function expression */
        char needed [Numphases];    /* usage "fully_used" status */
        TIMING timing[Numphases];
        ...
        } Node;
pNode node_list; /* pointer to complete list of nodes in the circuit */
typedef struct function *pFunction;
typedef struct function {
        char function_code; /* encoded function */
        pFunction sub_function;     /* pointer to sub-function
                                        if primary_input = FALSE
*/
        pNode input_node;   /* point to input node
                    if primary_input = TRUE */
        pFunction next;     /* next function entry at this level */
        } Function;
```

Figure 16:
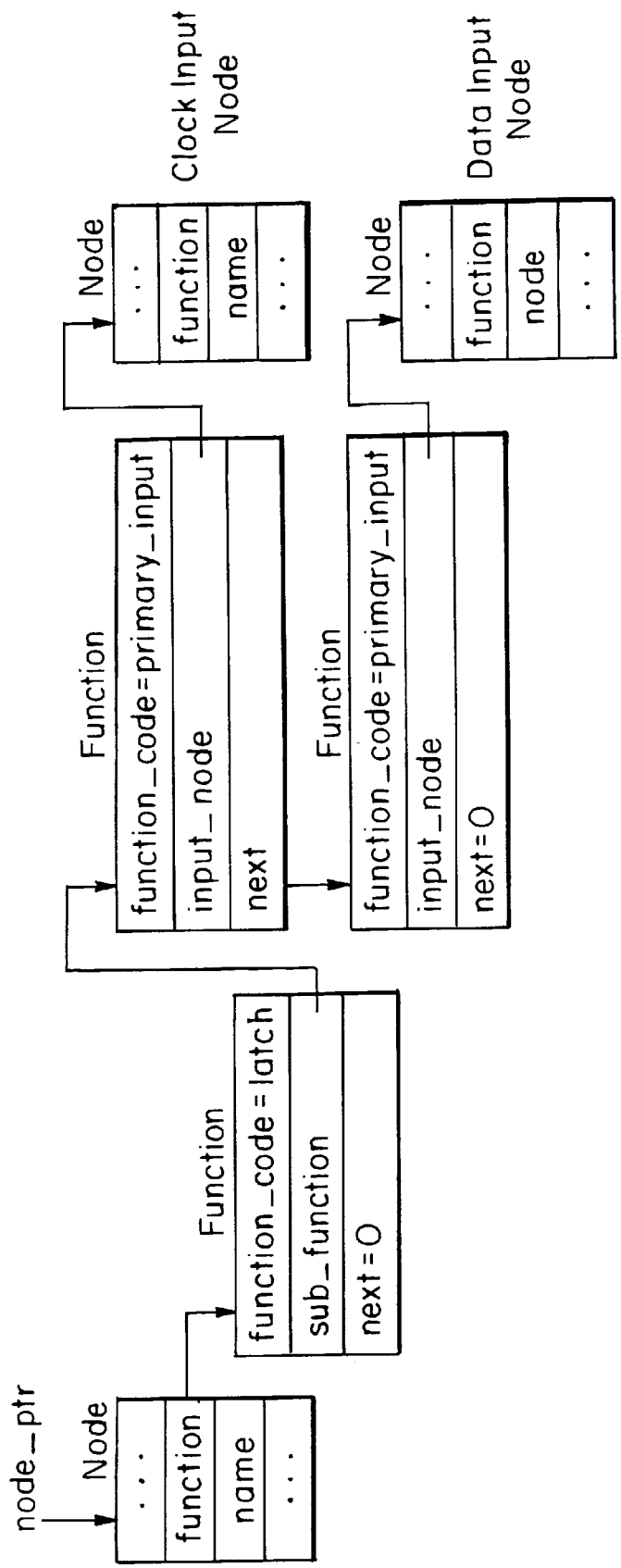
FIGS. 16 and 17 are data structure descriptions of nodes.
Figure 17:
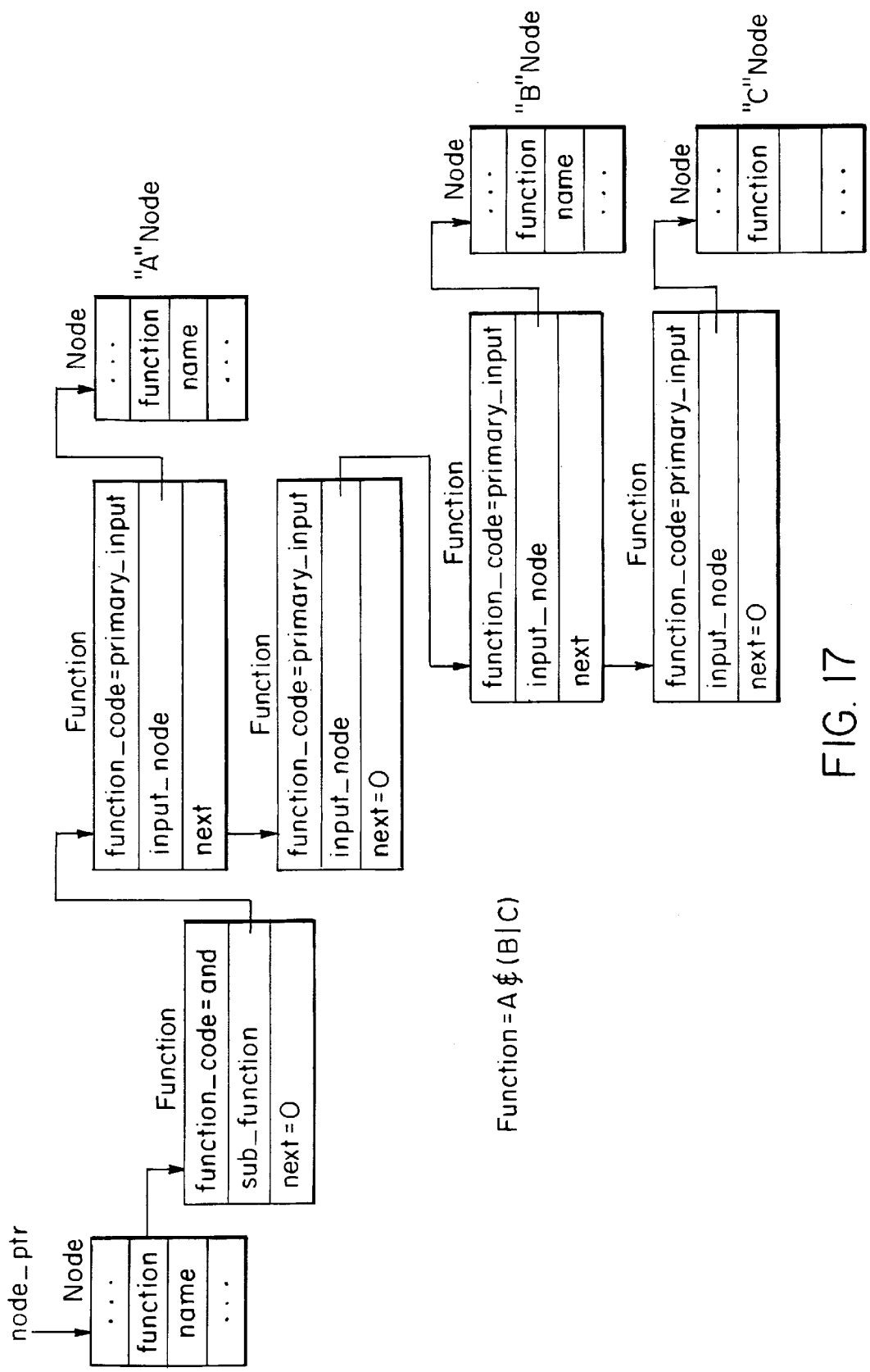

The function of a node needs further explanation. This example is implemented with a linked-list hierarchical structure. Simple logic structures and complex logic structures can both be represented by this mechanism. Two examples using this linked-list structure are a simple latch description, and complex gate shown in FIGS. 16 and 17 respectively.

Partitioning Logic into Evaluation Groups

Most gate-level logic simulators schedule logical evaluation of a gate whenever any of its inputs changes it value (called event-scheduling). If the output of a gate changes due to an input value changing, then subsequent gates having inputs tied to the first gate's output are re-evaluated, and so on. This process repeats for every stimulus pattern input.

Figure 1:
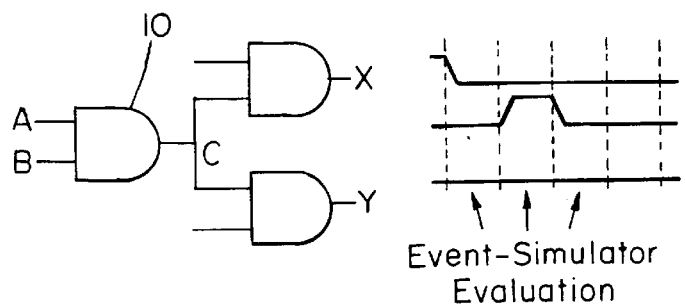
Figure 2:
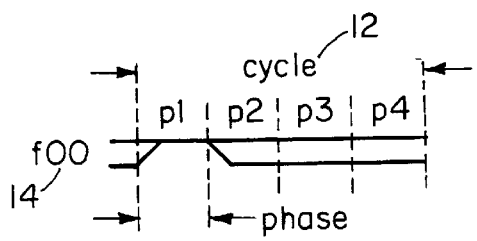
Figure 3:
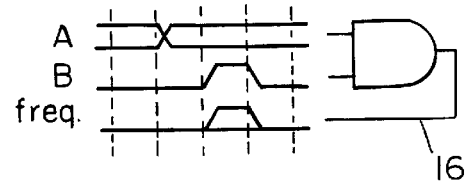

If an evaluated gate's output does not change value, then the re-evaluation wastes simulator time. Referring again to FIG. 1, a change in both input nodes A and B causes no change of output C. The gate driving node C is logically evaluated twice with no change in the output. While little time is wasted, because the evaluation of this particular gate is simple, evaluation of a logically more complex gate may waste significantly more simulator processing time.

It is known to reduce the re-evaluation overhead by creating larger groups of logic and logically ordering the groups in sequential steps. The simulator waits for input changes to occur for each group, and evaluates a group undergoing a change in input value in a single operation.

The frequency of logic evaluations depends on frequency of input value changes multiplied by the probability that the output of the evaluated gate changes value. Logic simulator performance has a direct relationship similar to the inverse of the frequency of changes. If the frequency of node state transitions is low, the overhead of event-driven mode simulation is considered low.

Figure 10:
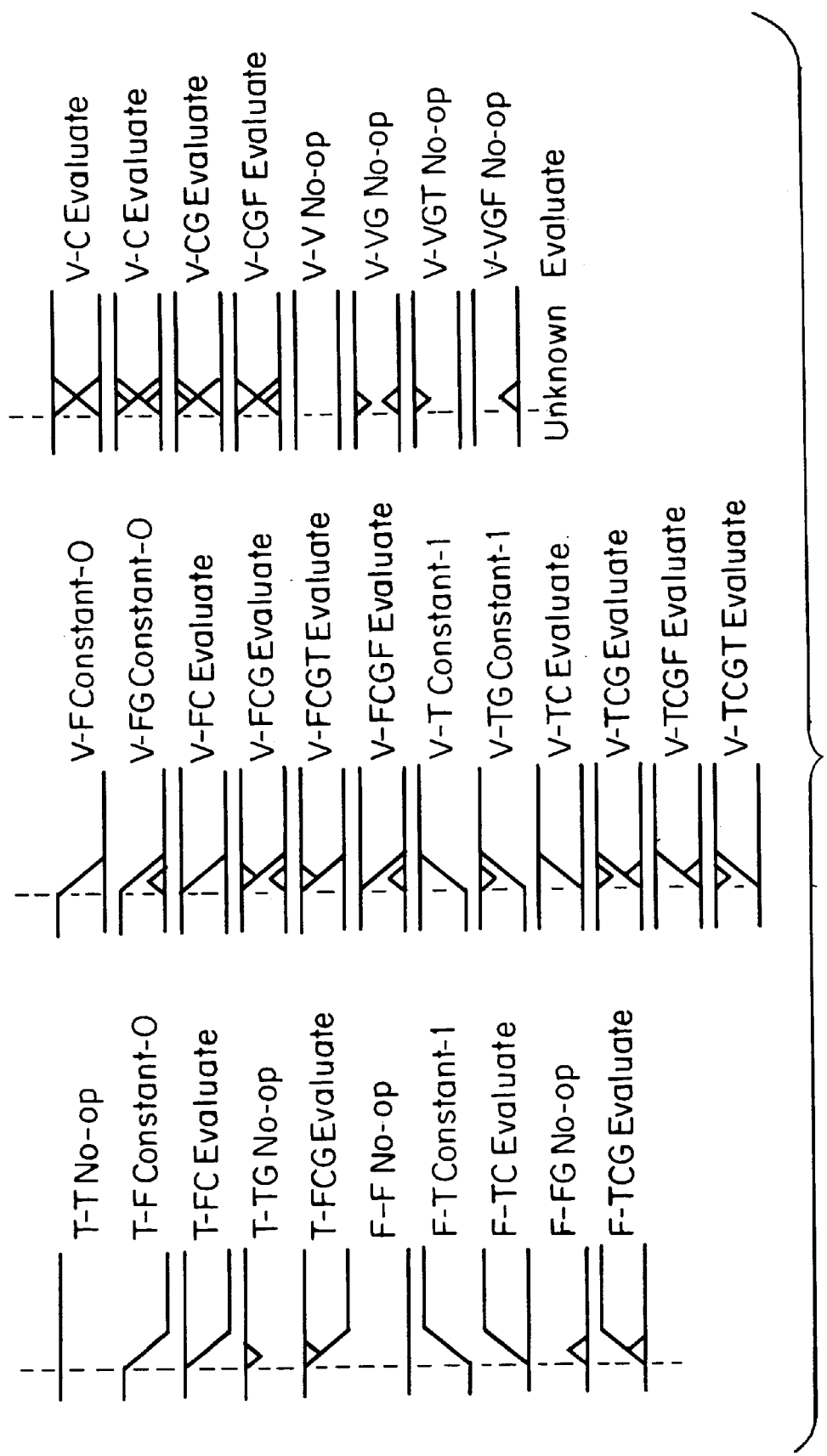

The following table (and FIG. 10) shows the relationship of the possible timing behavior for a node's phase, and what a compile-mode simulator should do.

| State | Action |
| --- | --- |
| T-T | No-op |
| T-F | Constant-0 |
| T-FC | Evaluate |
| T-TG | No-op |
| T-FCG | Evaluate |
| F-F | No-op |
| F-T | Constant-1 |
| F-TC | Evaluate |
| F-FG | No-op |
| F-TCG | Evaluate |
| V-F | Constant-0 |
| V-FG | Constant-0 |
| V-FC | Evaluate |
| F-FCG | Evaluate |
| V-FCGT | Evaluate |
| V-FCGF | Evaluate |
| V-T | Constant-1 |
| V-TG | Constant-1 |
| V-TC | Evaluate |
| V-TCG | Evaluate |
| V-TCGF | Evaluate |
| T-TCGT | Evaluate |
| V-C | Evaluate |
| V-CG | Evaluate |
| V-CGT | Evaluate |
| V-CGF | Evaluate |
| V-V | No-op |
| V-VG | No-op |
| V-VGT | No-op |
| V-VGG | No-op |
| Unknown | Evaluate |

An Evaluate action means that the logic must be re-evaluated for that node for that simulation phase.

A Constant means the simulator would always produce the constant value in a logical evaluation. The timing behavior leads to this pre-calculated result, improving simulator performance.

The No-op means, regardless of what is happening to the input of the logical function, the output never changes value. This saves simulator overhead by filtering out any unimportant input changes that don't affect the output.

Some circuit designs use a technique known as synchronous clocking, which restricts the design to a single-clock input. Except for primary inputs to the design, all changes to node values occur in response to value changes on the single clock input. Logic simulation of synchronous clocked designs have been done by event-driven simulation methods. Because the clocking event always exists, there is a fixed minimum node change frequency, and therefore a maximum simulator performance. Simulator performance degrades because other nodes in the design will also change value, increasing total node change frequency.

Figure 11:
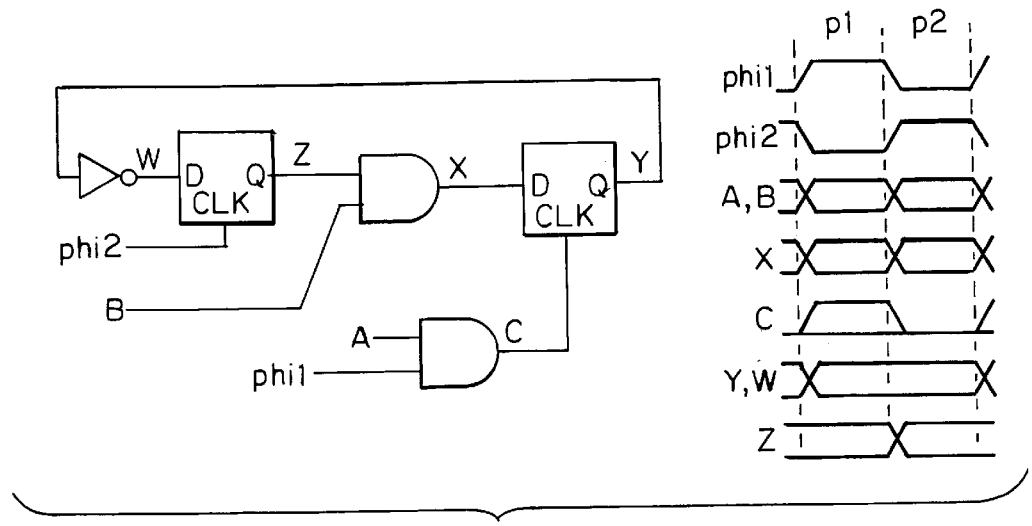

Referring to FIG. 11, the timing behavior for the following example indicates a possible logical change in the second phase, otherwise the node is logically zero. Compared to the standard event-driven method that took three evaluations, using this method significantly saves simulator time by requiring only one logical evaluation, and a fixed constant result.

The logic of FIG. 11 has a two-phase synchronous clocking method. Its timing behavior is also shown. Node C has fewer value evaluations than does one of its logical inputs node A. The calculated timing behavior of C can make a conditional pulse high in p1, and always results in a pre-determined low constant in p2. The logical latches (Z and Y) change values on zero-to-one value changes of phi2 and phi1 respectfully.

With this timing behavior, the operations that have to be performed per simulation phase have been determined. The next step in developing a simulation model is to order those evaluations per simulation phase, allowing them to permit the logical sequential flow of logic. For instance, the value of node X is dependent upon the value of node Z. For the second simulation phase, it would make sense first to evaluate the new value of Z before calculating the new value of X, reducing the number of logical operations that the simulator must perform to emulate the behavior of the circuit. The nodes are prepartitioned into buckets of Evaluations and Constants, one bucket of activity for each logical phase of the design. This partitioning results in one of the following operations for each node in each phase:

1. Logically Evaluate the node's function
2. Produce a Constant for the node.
3. Do nothing for the node.

Additional sorting of the operations for each phase produces the complete execution model for the corresponding phase. Sorting determines the inputs and outputs of the partition, and the order of execution in the partition so that inputs are evaluated before outputs of each function.

The equivalent logical behavior for the example as derived from circuit and timing behavior and expressed in a programming-type language would be as follows:

```
if (simulation phase 1) {
    phi1 = 1;
    phi2 = 0;
    C = phi1 & A;
    X = Z & B;
    Y = C & X | !C & Y;
    W = !Y;
if (simulation phase 2) {
    C = 0
    phi2 = 1;
    phi1 = 0;
    Z = phi2 & W | !phi2 & Z;
    X = Z & B;
    }
```

Using timing behavior constants to reduce logical evaluation groups

With the timing behavior known, the worst-case logical operations that have to be performed, per simulation phase, have been pre-determined.

The next step is to propagate the effects of the constants in the network. In this step, equations are logically reduced with the known input constants until no further reductions are possible. The results of this propagation on the previous example is as follows:

```
if (simulation phase 1) {
    phi1 = 1;
    phi2 = 0;
    C = A
    X = Z & B;
    Y = C & X | !C & Y;
}
if (simulation phase 2) {
    C = 0;
    phi2 = 1;
    phi1 = 0;
    Z = W;
    X = Z & B;
}
```

In this example, the logically reduced equations can be implemented minimally in either hardware or software. In more complex designs, the effect can be much more significant.

Other embodiments are within the following claims.

What is claimed is:

1. A method executed in a computer for reducing the number of calculations in a simulation by elimination of predetermined unnecessary states in designing or implementing a synchronous circuit having nodes interconnecting a plurality of logic functions and in which said nodes each assume a logic value in a plurality of successive clocked phases of a logical cycle, comprising:

for a current phase of said plurality of successive clocked phases, determining by the use of a table, which of said nodes are inputs for each logic function of said plurality of logic functions, prior to running a computer simulation of said phase in said computer of said synchronous circuit:
  a) which nodes connected to an input of the logic function have timing behaviors in said phase that are needed to determine the logic value assumed by an output node of said logic function in said phase, and
  b) which nodes connected to an input of the logic function do not have timing behaviors in said phase that are needed to determine the logic value assumed by an output node of said logic function in said phase;

storing in said computer in a table, prior to running said computer simulation of said synchronous circuit, information, based upon said determining, which identifies nodes which are needed to determine the logic value assumed by said output node in said phase and nodes which are not needed to determine the logic value assumed by said output node in said phase; and using said stored information based upon said determining to reduce the number of evaluations of said logic values when said computer simulation of said synchronous circuit is run in said computer by eliminating said nodes not needed to determine the logic value assumed by said output node in said phase.

2. The method of claim 1 further comprising using said stored information based upon said determining to reduce the number of logic functions implemented in said synchronous circuit.

3. The method of claim 1 wherein said step of determining is performed initially by said computer with respect to said output node of said logic functions connected to pre-identified outputs of the synchronous circuit and is repeated for logic functions whose outputs are identified by reference to said table as having timing behaviors needed for the output logic functions, and so on, iteratively.

4. The method of claim 1 wherein said step of determining is performed successively by said table in said computer for all phases of said plurality of successive clocked phases for the output node of the logic function.

5. The method of claim 1 wherein said step of determining in said computer includes analyzing which nodes connected to an input of the logic function enable the logical function and which nodes connected to an input of the logic function dominantly block the logic function, and storing said analysis in said table.

6. The method of claim 5 in which the step of analyzing which nodes connected to an input of the logic function enable the logic function and which nodes connected to an input of the logic function dominantly block the logic function is performed iteratively in said computer with respect to successive logic functions in an input chain of functions using a table which associates with each probable combination of logic function and timing behavior, an indication of a preferred procedure to use in determining whether nodes connected as inputs to the logic function have timing behaviors which are needed or not needed.

7. Apparatus for use in a computer for reducing the number of calculations in a simulation by elimination of predetermined unnecessary states in designing a synchronous circuit having nodes interconnecting a plurality of logic functions and in which said nodes each assume a logic value in a plurality of successive clocked phases of a logical cycle, comprising:

means for determining for each likely possible logic function state of said plurality of logic functions prior to running a computer simulation of said synchronous circuit, for a current phase of said plurality of successive clocked phases,
  a) which nodes connected to an input of the logic function have timing behaviors in said phase that are needed to determine the logic value assumed by an output node of said logic function in said phase, and
  b) which nodes connected to an input of the logic function do not have timing behaviors in said phase that are needed to determine the logic value assumed by an output node of said logic function in said phase;

storage for storing, prior to running said computer simulation of said synchronous circuit, information, based upon said determining, which identifies nodes which are needed to determine the logic value assumed by said output node in said phase and nodes which are not needed to determine the logic value assumed by said output node in said phase; and means for using said stored information based upon said determining to reduce the number of evaluations of said logic values when said computer simulation of said synchronous circuit is run by eliminating said nodes not needed to determine the logic value assumed by said output node in said phase.

* * * * *

UNITED STATES PATENT AND TRADEMARK OFFICE
CERTIFICATE OF CORRECTION

PATENT NO. : 5,978,571

DATED : November 2, 1999

INVENTOR(S) : William John Grundmann

It is certified that error appears in the above-identified patent and that said Letters Patent is hereby corrected as shown below:

Column 4, line 57, change "15b" to --15c--.

Column 23, line 32, change "15b" to --15c--.

Signed and Sealed this

Eighteenth Day of April, 2000

*Attest:*

Q. TODD DICKINSON

*Attesting Officer*     *Director of Patents and Trademarks*